Oct. 8, 1963 V. R. DE LONG ETAL 3,106,680
VARIABLE THRESHOLD HIGH GAIN ALC CIRCUIT
Filed Nov. 16, 1961
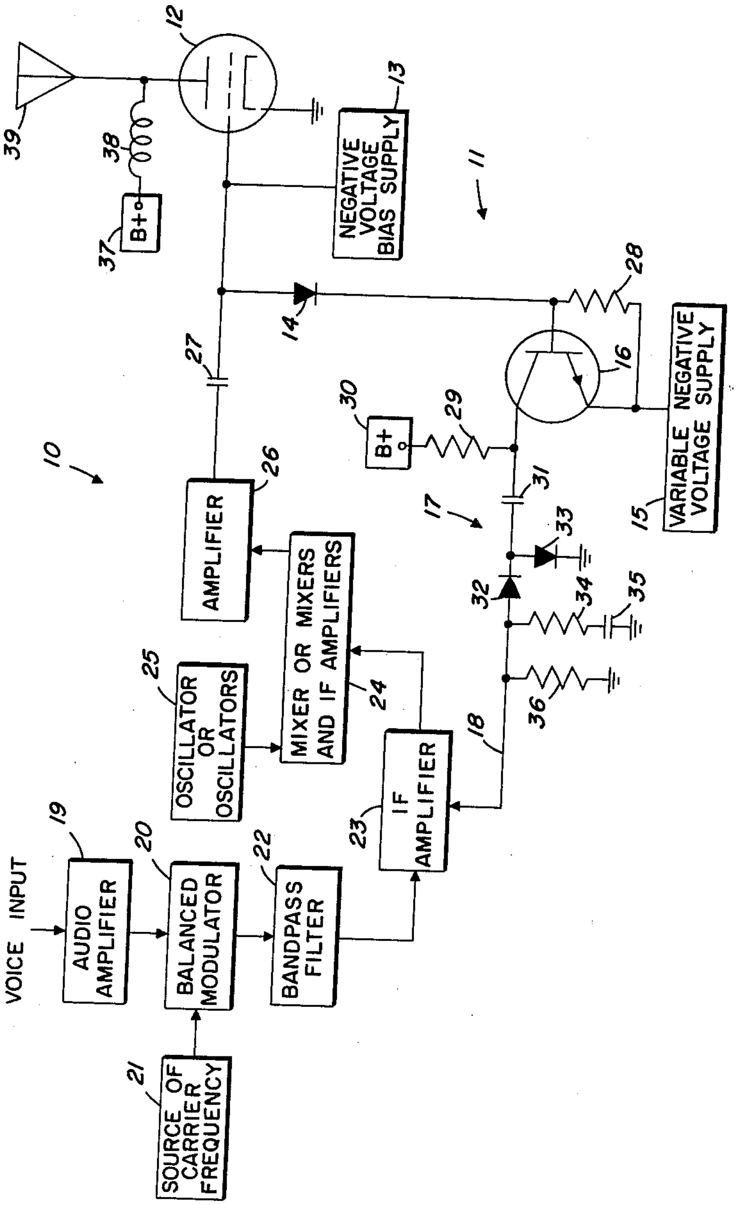
INVENTORS
VINCENT R. DeLONG
JOHN D. DUNCAN
BY Moody and Kintzinger
ATTORNEYS United States Patent Office 3,106,680

Patented Oct. 8, 1963

3,106,680
VARIABLE THRESHOLD HIGH GAIN ALC CIRCUIT

Vincent R. De Long, Marion, and John D. Duncan, Cedar Rapids, Iowa, assignors to Collins Radio Company, Cedar Rapids, Iowa, a corporation of Iowa Filed Nov. 16, 1961, Ser. No. 152,886
10 Claims. (Cl. 325—187)

This invention relates in general to transmitter gain control, and in particular to an automatic load control which amplifies the signal developed with very low current flow through an adjustable threshold control circuit.

Many automatic load control circuits used in transmitters are adapted for amplification gain control through voltage bias developed with grid current flow. With an automatic load control device utilizing the grid current type of feedback, used in a transmitter, appreciable grid current is required for actuating ALC. A further requirement of grid current actuated ALC systems is the use of a relatively high resistance in the negative voltage line to the control grid to develop ALC voltages. This results in high D.C. impedance in the grid voltage biasing circuit and gives rise to grid modulation which results in signal distortion. Another limitation with automatic load control systems utilizing grid current feedback is that peak power limiting is sacrificed when the transmitter is operated on reduced peak power. A further limitation of grid current actuated ALC systems is such systems do not allow ALC control with CW signaling due to the D.C. nature of the grid current. Further, grid block keying is greatly complicated and expensive with grid current ALC systems.

It is, therefore, a principal object of this invention to provide a transmitter having an adjustable threshold ALC and power amplifier grid voltage bias independent of ALC.

Another object is to provide a fast response ALC requiring much less actuating current than is normally drawn with grid current ALC actuation.

Further objects include elimination of relatively high resistance generally required heretofore in the grid voltage bias line for developing usable ALC voltage with grid current, and to substantially eliminate grid modulation and distortion in the power amplifier of a transmitter.

Another object is to provide a transmitter having ALC while transmitting CW signals.

A further object is to provide a relatively simple, clean, and inexpensive system for grid block keying in a transmitter having ALC.

A feature of this invention useful in accomplishing the above objects is a relatively low impedance grid voltage biasing circuit independent of ALC in a transmitter equipped with ALC. The ALC circuitry is arranged for amplifying the voltage signal developed with low current flow through an adjustable threshold control circuit and for applying such amplified ALC voltage signals to amplifier gain control means in the transmitter. This includes a diode and a resistor connected in series between a variable negative voltage supply and the grid of the power amplifier, and with the diode having its anode connected to the grid. An NPN transistor is used having its emitter connected to the variable negative voltage supply, its base connected to the junction between the diode and the resistor, and its collector connected to a B+ voltage supply. The NPN transistor is also coupled through a negative voltage doubler-rectifier circuit and an ALC line to amplifier gain control means in the transmitter.

A specific embodiment representing what is presently regarded as the best mode of carrying out the invention is illustrated in the accompanying drawing:

Referring to the drawing:

The transmitter, generally indicated by the number 10, is equipped with an adjustable threshold automatic load control (ALC) system 11. Transmitter 10, which is fed audio signals to be transmitted, is equipped with an output power amplifier 12. A negative voltage bias supply 13 provides the operating voltage bias for the grid of power amplifier 12. Diode 14 and a variable negative voltage supply 15, for adjustably controlling the threshold of current flow through diode 14, are components of a system giving ALC that is developed generally without requiring current flow in the voltage bias supply 13-power amplifier grid circuit. The ALC signals are amplified through transistor 16, and applied through negative voltage doubler and rectifier circuit 17, and ALC line 18 to amplifier gain control circuitry in transmitter 10.

More specifically, an originating audio signal to be transmitted, which may be a voice input, is amplified by audio amplifier 19. The audio signal is then heterodyned in balanced modulator 20 (any conventional modulator could be used) with a carrier frequency from a source 21. The output, as a transmitter drive voltage, from modulator 20 is fed through band pass filter 22 to I.F. amplifier 23. I.F. amplifier 23 is subject to gain control by negative automatic load control voltages that may be applied through line 18.

The output from the I.F. amplifier may be applied to a mixer or mixers, and additional I.F. amplifiers, indicated generally by block 24. The mixer or mixers of block 24 are fed an additional frequency input or inputs, as the case may be, from oscillator or oscillators, indicated generally by block 25. The ultimate output from block 24 is fed to amplifier 26 from which the output is coupled through capacitor 27 to the grid of power amplifier 12. The power amplifier 12 may be a conventional type operable as a class $A_1$, or $AB_1$ amplifier. Bias for example, minus 60 volts, for the grid of power amplifier 12 is supplied by constant negative voltage supply 13.

The variable negative voltage supply 15 of ALC system 11, is connected through resistor 28 to the cathode of diode 14, the anode of which is connected to the grid of power amplifier 12. The back bias of diode 14 is controlled, by variable negative voltage supply 15 relative to the voltage of negative voltage bias supply 13, for adjustably controlling the threshold of current flow through diode 14. NPN transistor 16 is included as part of ALC system 11, with its base connected to the junction of diode 14 and resistor 28, its emitter to variable negative voltage supply 15, and its collector connected through resistor 29 to B+ voltage from voltage supply 30.

The collector of transistor 16 is also connected through negative voltage doubler and rectifier circuit 17. The voltage doubler and rectifier include capacitor 31, diode 32, and diode 33. The anode of diode 32 is connected to ALC line 18 and the cathode is connected to capacitor 31. The anode of diode 33 is connected to the junction of diode 32 and capacitor 31, and the cathode is connected to ground. The ALC line 18 is connected serially through resistor 34 and capacitor 35 to ground, and also through resistor 36 to ground. Resistor 34 is of a relatively low value while resistor 36 is of a higher value in order to provide a fast-attack-slow-discharge RC network for modifying the output of voltage doubler being applied through ALC line 18 in controlling the gain of I.F. amplifier 23.

The plate of power amplifier 12 is positively biased, for example, B+ voltage from voltage supply 37 through a coil 38 used as a choke for blocking R.F. The output from power amplifier 12 is fed to transmitting antenna 39. It should be noted that, since the ALC system 11 is isolated from the grid of power amplifier 12 by diode 14, problems generally encountered with grid block keying are alleviated. In fact, ALC system 11 can be made to operate on substantially all modes of emission.

In operation, the ALC system 11 is activated for controlling the gain of the transmitter 10 whenever current pulses commence to flow through diode 14. Of course, the back bias of diode 14 may be so adjusted by varying the voltage of voltage supply 15 that ALC is activated at peak signal levels below signal voltage levels giving grid current flow. Whenever peak signal voltages applied to the grid of power amplifier 12 reach the voltage value of negative voltage bias supply 13 minus the voltage of variable negative voltage supply 15, diode 14 will conduct. In other words, diode 14 conducts below a peak signal level that would give grid current flow by the amount of voltage set on the variable negative voltage supply 15. If the voltage setting of voltage supply 15 is at substantially zero volts, peak signals of the transmitter could give rise to grid current flow in power amplifier 12. However, with grid current flow, the impedance of the grid-negative voltage bias supply 13 circuit may rise sufficiently that the corresponding high peak signal voltage is sufficient to give current flow through diode 14. Thus, it is possible to have ALC while having grid current flow in an ALC system independent of grid current flow.

Whenever the positive peaks of the signal being applied to the grid of power amplifier 12 are sufficiently high to give current flow through the circuit of diode 14, ALC is actuated. As this occurs, the pulses of current flow through diode 14 from the signal voltage peaks develop voltage pulses across resistor 28 and simultaneous pulses of current enter the base of transistor 16. The current pulses entering the base of transistor 16 are amplified at the collector and then develop voltage pulses of increased magnitude across resistor 29. The voltage pulses developed at the junction of resistor 29 and the collector of transistor 16 are applied through negative voltage doubler and rectifier circuit 17 and ALC line 18 to amplifier gain control circuitry in transmitter 10. Current flow through diode 14 in the approximate range 4–5 microamperes has proven sufficient for actuating ALC. This is considerably less than the 50–100 microampere current flow normally required with ALC systems actuated by grid current flow.

Thus, from the foregoing description it will be seen that a highly versatile ALC system having means for amplifying signals developed with relatively low current flow through an adjustable threshold control circuit has been provided. ALC is provided that not only allows a low impedance voltage bias supply to be used for the power amplifier, thus decreasing distortion due to bias shift, but also has high gain providing signal ALC voltages at a minimum of signal voltage peak flatening. The ALC system is so isolated from the grid bias circuit that grid block keying may be accomplished with no transient effects on ALC. The variable negative voltage supply of the ALC system is also a means of choosing desired levels of ALC threshold from a maximum power output with peak voltage signals giving grid current flow on down to substantially zero power output.

Whereas this invention is here illustrated and described with respect to a specific embodiment thereof, it should be realized that various changes may be made without departing from the essential contribution to the art made by the teachings hereof.

We claim:

1. A radio transmitting system having a power amplifier with a control element, a minus voltage bias supply directly connected to said control element, and automatic load control circuitry for controlling the gain of the transmitting system; said automatic load control circuitry including: a resistor, a diode having an anode and a cathode with the anode connected to said control element of the power amplifier, a variable negative voltage supply connected through said resistor to the cathode of said diode, and a transistor with high gain for providing useful ALC voltages in controlling the gain of the transmitting system with two electrodes of the transistor connected to opposite ends of said resistor.

2. The radio transmitting system of claim 1, wherein said transistor is an NPN transistor having a base connected to the junction of said resistor and the diode, an emitter connected to said variable negative voltage supply, and a collector connected through a second resistor to a positive voltage supply.

3. In an automatic load control system for a radio transmitter having a power amplifying output device with a control element connected to a first voltage biasing source negative relative to ground, an electrode connected to ground, an output element connected to a second voltage biasing source positive relative to ground, and including signal amplifying means providing an output R.F. signal, gain control means in said signal amplifying means, and means for applying the output R.F. signal from said signal amplifying means to said control element with these interconnected for well known operation in an R.F. transmitter; a third voltage biasing source negative relative to ground, impedance means and a unidirectional current flow device serially connected between said third voltage biasing source and said control element, said unidirectional current flow device being connected for plus to minus current flow from said control element, resistive means, and a high gain amplifying device connected to the junction of said unidirectional current flow device and said impedance means, the third voltage source, and through said resistive means to a voltage supply positive relative to ground for providing useful ALC voltages in controlling the gain of the radio transmitter.

4. The automatic load control system of claim 3, wherein said unidirectional current flow device is a diode having an anode connected to said control element and a cathode connected through said impedance means to said third voltage biasing source, and said impedance means comprises a resistor.

5. The automatic load control system of claim 3, wherein said high gain amplifying device is an NPN transistor with the base connected to the junction of said unidirectional current flow device and said impedance means, the emitter connected to the third voltage source, and the collector connected through said resistive means to a voltage supply positive relative to ground, and with means for coupling said transistor collector to said gain control means of the signal amplifying means.

6. The automatic load control system of claim 5, wherein said third voltage biasing source is a variable negative voltage source for controlling the back voltage bias applied to said device.

7. The automatic load control system of claim 5, wherein said means for coupling said transistor collector to said gain control means of the signal amplifying means includes; a negative voltage doubler-rectifier circuit, an ALC line, and a fast-attack-slow-discharge RC network connected to said ALC line and ground.

8. The automatic load control system of claim 7, wherein a capacitor is provided between the collector of said transistor and the ALC line.

9. The automatic load control system of claim 3, wherein the circuit including the control element of said power amplifying output device, said first voltage biasing source negative relative to ground, and line means connecting the control element to said first voltage biasing source is a very low impedance circuit.

10. The automatic load control system of claim 9, wherein said power amplifying output device is a power amplifying tube with at least three elements, said control element being a control grid in said tube directly connected to said first voltage source negative relative to ground, said electrode connected to ground being a cathode connected to ground, said output element being an output plate connected to said second voltage biasing source positive relative to ground through choke means, and said output plate also being connected to a transmitting antenna.

References Cited in the file of this patent

UNITED STATES PATENTS 3,013,148 De Long et al. ---------- Dec. 12, 1961